United States Patent [19]

Kim

[11] Patent Number: 5,054,681
[45] Date of Patent: * Oct. 8, 1991

[54] COMPONENT DESOLDERING TOOL

[76] Inventor: Henry I. Kim, 12665 Salmon River Rd., San Diego, Calif. 92129

[ * ] Notice: The portion of the term of this patent subsequent to Jan. 23, 2007 has been disclaimed.

[21] Appl. No.: 557,451

[22] Filed: Jul. 25, 1990

[51] Int. Cl.$^5$ .............................................. B23K 3/02
[52] U.S. Cl. ..................................... 228/191; 228/51; 228/55
[58] Field of Search .................... 228/119, 180.2, 191, 228/264, 51, 55; 29/764

[56] References Cited

U.S. PATENT DOCUMENTS

| | | | |
|---|---|---|---|
| 1,297,245 | 3/1919 | Reddicliffe | 228/55 |
| 1,881,698 | 10/1932 | Kuriyama | 228/55 |
| 2,724,041 | 11/1955 | Anton | 228/55 |
| 3,393,857 | 7/1968 | Taylor, Jr. et al. | 228/51 |
| 3,529,760 | 9/1970 | Hickman et al. | 228/51 |
| 4,528,746 | 7/1985 | Yoshimura | 228/55 |
| 4,858,820 | 8/1989 | Kent | 228/51 |
| 4,896,019 | 1/1990 | Hyun | 228/51 |
| 4,962,878 | 10/1990 | Kent | 228/55 |

FOREIGN PATENT DOCUMENTS 2609919  7/1988  France .................................. 228/51
113172  5/1989  Japan .................................... 228/51

OTHER PUBLICATIONS

IBM Technical Disclosure Bulletin, "Soldering Iron Tip", vol. 1, No. 2, p. 18, Aug. 1958.
Research Disclosure, "Hot Air Deflector . . . ", Kenneth Mason Publications Ltd., England, No. 281, Jul. 1988.

Primary Examiner—Samuel M. Heinrich
Attorney, Agent, or Firm—Ralph S. Branscomb

[57] ABSTRACT

A tool for desoldering quadrilateral surface-mount components such as integrated circuits which have a row of leads on each of the four sides, the tool comprising a metallic hood with a depending skirt which contacts the rows of leads when the hood is snapped over the component. The hood is heated with a hot air gun or a heating element, and conducts the heat to the leads, melting the solder connecting the leads to the pads of the circuit board, permitting the component to be lifted off of the circuit board.

7 Claims, 2 Drawing Sheets

COMPONENT DESOLDERING TOOL

BACKGROUND OF THE INVENTION

The invention pertains to circuit board manufacturing technology, and in particular to the removal of four-sided surface mounted integrated circuits.

The manufacturing of circuit boards has moved largely from circuit boards in which the integrated circuits and other components have pass-through pins which are soldered on the opposite side of the circuit board from the body of the component, to surface-mount technology. Using surface-mount technology, integrated circuits and some other components have short leads which curl under the component, rather than projecting outwardly. The curled leads are soldered to conductor pads on the same side of the circuit board as the component.

In most circuit board manufacturing, the boards are tested at quality control points during assembly to insure that the components are working as they are designed to after the mounting process. Depending on the complexity and expense of the circuit board, if it is found to be malfunctioning it may either be discarded, or the faulty component removed and replaced. This invention relates to the removal of faulty components.

Components having pass-through pins are relatively easy to remove because the solder is on the planar, unobstructed surface opposite the side of the circuit board to which the components are mounted. Hot solder baths, on which the inventor of the instant invention has patents pending, can be applied to the pins of the suspect component to melt the solder and enable the component to be popped off from the opposite side.

However, this technique obviously cannot be used with surface mounted components. For surface mounted components, the instant applicant has developed a line of long, relatively sharp soldering blades which can be applied along an entire row of pins on an integrated circuit, either to solder them or to desolder them for removal from the circuit board. These tools can be used to remove components having two rows of leads, on opposite sides of the component. With the elongated soldering blade, the sides can be sequentially heated and lifted from the board.

However, this technique will not work with surface mount components having leads on all four edges of the chip. Obviously, if one row of leads is heated to melt the solder, but the solder is still solid on the other three sides, the heated side cannot be raised from the board.

According to current circuit board manufacturing techniques, there is no problem-free way of removing surface mount components having a four-sided lead array. The problem is complicated by the fact that one of the principle advantages of surface mount technology is that it allows the more compact mounting of components, particularly the enabling of the mounting of components on both sides of the board. To further effectuate this goal, the components are mounted together in a fairly close configuration, so that an attempt to melt the solder on one row of leads is likely to affect the integrity of adjacent solder connections on nearby components.

This is the downfall of the currently available tool which is most adequate for the job. This tool is a specialized nozzle for a hot air gun which directs hot air in four elongated streams simultaneously to the four rows of surface mount leads. The nozzle is provided in a number of different sizes and each size fits around and over a particular size IC, forcing the hot air directly at the leads on all four sides.

The problem lies in the fact that there is no way, when directing relatively large quantities of very hot air at the leads of the component to be removed, to prevent adjacent components from being affected. Thus, the suspect component can be removed and replaced, only to find that the removal process has caused electrical discontinuities in adjacent components.

There is thus a need for some tool or some technique which could adequately heat and remove the solder from the leads of a four-sided, surface mounted, integrated circuit without affecting closely spaced, adjacent components.

SUMMARY OF THE INVENTION

The instant invention fulfills the above stated need in a very effective and also very simple manner. The desoldering component disclosed herein comprises a simple copper hood, with a base panel which lies spaced above the upper, flat surface of the integrated circuit, and which defines depending skirt portions on the four sides of the component which extend down into contact with the component leads. The copper hood must of course be sized appropriately for the specific component to be removed. It is pressed onto the component, with the depending skirt portions snapping onto the rows of leads, which protrude slightly laterally of the component to permit their compressing contact by the copper skirt portions of the hood. The hood is dimensioned and shaped so that when it is pressed onto a component as far as it will go so that the skirt portions are pressed against the mounting pads of the underlying circuit board, both the top (base) and sides (skirt portions) of the hood are spaced from the ceramic body of the integrated circuit, with only the metal leads being contacted so that the possibility of heat damage to the component is minimized, preventing unnecessary damage in the event the component is not faulty after all.

In the first embodiment, heat is applied to the hood by means of a hot air gun directed downwardly onto the base panel of the hood. In this embodiment, in addition to the hood, a removal clip is provided which inserts between the hood and the component extending out through the gap between any pair of adjacent skirt portions. This clip has a loop inside the hood and an extending handle such that after the solder has been melted the component can be conveniently removed with the hood by lifting the clip handle. Subsequently, the clip can be rotated with the handle to separate the component from the hood.

In a second embodiment, the hood is heated by a special electrical heating element, which may be an integral unit in the form of a special soldering iron tip.

DETAILED DESCRIPTION OF THE PREFERRED EMBODIMENTS

Figure 1:
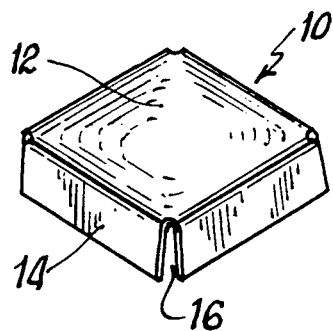
FIG. 1 is a perspective view of the top of the hood portion of the invention.
Figure 2:
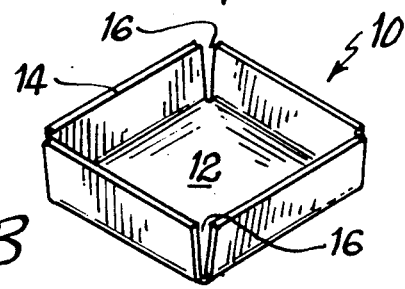
FIG. 2 is a perspective view of the hood as it appears inverted.
Figure 3:
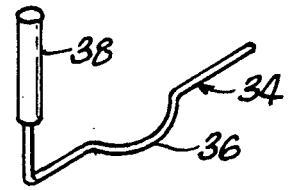
FIG. 3 is a perspective view of the removal clip portion of the tool.
Figure 5:
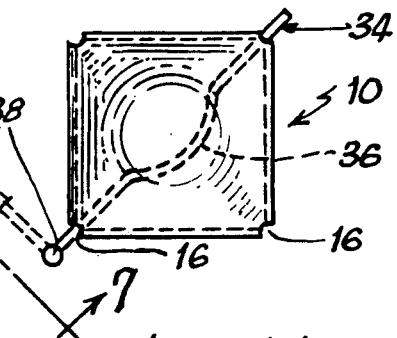
FIG. 5 illustrates the manner in which the removal clip lies underneath the base of the hood in use.

As best seen in FIGS. 1 and 2, the tool in its simplest form of the first embodiment comprises a hood 10 having a central, planar base portion 12 and four depending, integral skirt portions 14. The skirt portions are preferably spaced from one another so that gaps 16 are formed between them, both to make the individual skirt portions more resilient, and also to permit them to be squeezed with the fingers so that they fit more tightly, inasmuch as they tend to expand with use so that they do not fit as tightly on the lead rows as they should.

Figure 4:
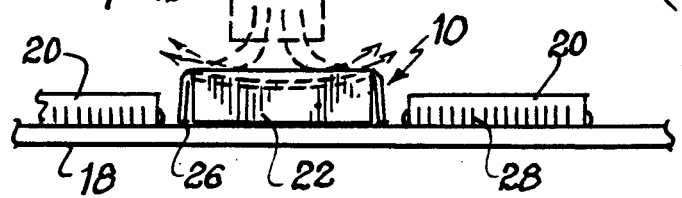
FIG. 4 illustrates the tool in use removing an integrated circuit chip.

A typical circuit board 18 is shown in FIG. 4. The board has other integrated circuits and components 20 mounted to it in addition to the integrated circuit 22 which is to be removed.

Figure 6:
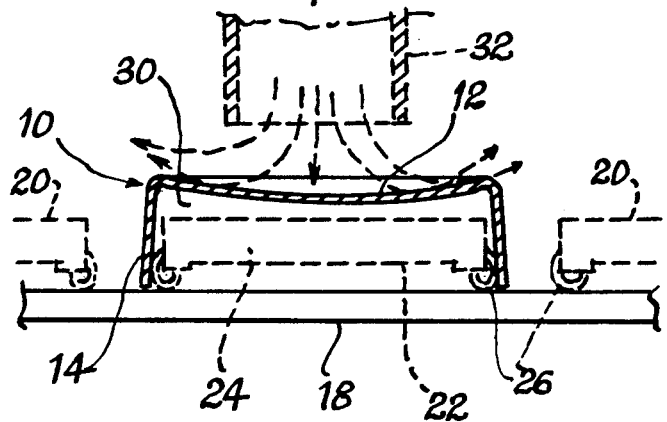
FIG. 6 illustrates the flow of the air as it is blasted from the hot air gun onto the concave upper surface of the hood.
Figure 7:
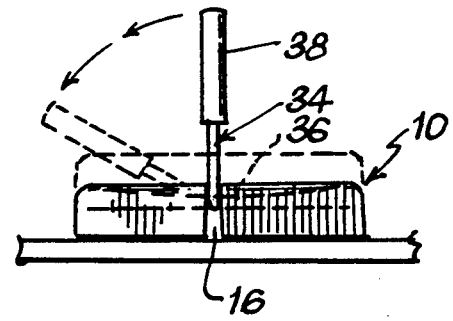
FIG. 7 illustrates the popping of the hood off of the integrated circuit by rotating the extended clip handle.
Figure 8:
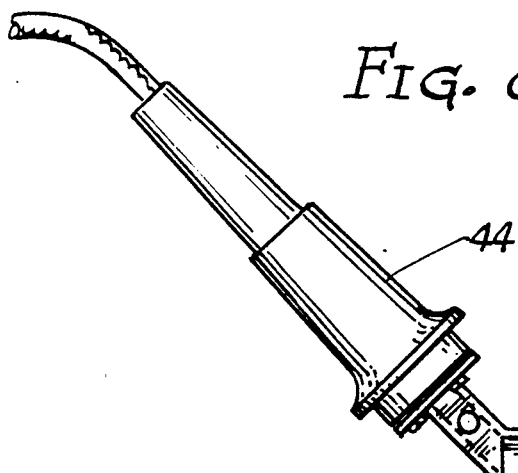
FIG. 8 is a side elevation view of a modification of the invention in which a soldering iron attaches to a special tip mounted on the hood to provide the necessary heat.
Figure 9:
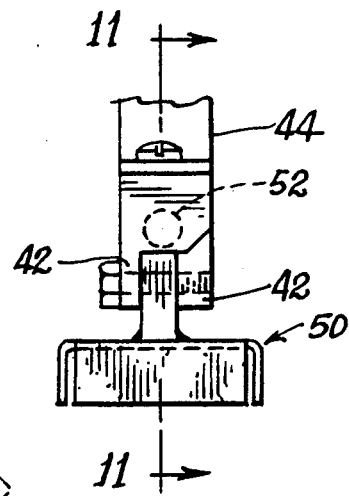
FIG. 9 is a fragmentary elevation view taken along line 9—9 of FIG. 8.
Figure 10:
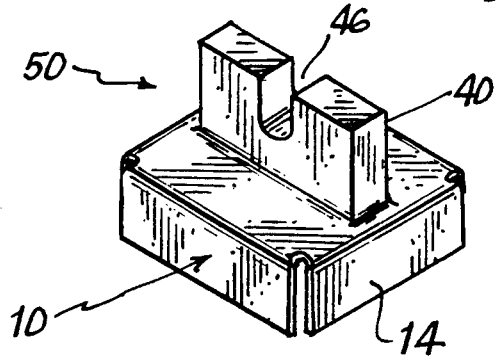
FIG. 10 is a perspective view of the hood with the integral solder tip.
Figure 11:
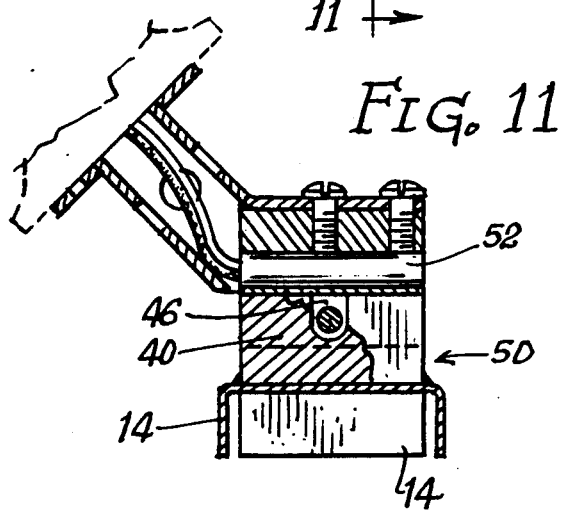
FIG. 11 is a section taken along line 11—11 of FIG 10.

Typical of integrated circuits, they have a ceramic body 24, and the leads 26 which, in surface mount components, are rather short and curl beneath the body portion as shown in FIG. 6. The leads form in rows 28 along each side of the integrated circuit, as shown in FIG. 4, and fortunately for the effectiveness of the instant invention, they protrude laterally slightly as shown in FIG. 6. Because of this lateral protrusion, it is relatively easy to insert the hood 10 over the component 22 such that the skirt portions 14 contact the laterally protruding rows 28 of the leads 26. The invention will work on components having leads on at lease two sides, although four-sided implementation is most common.

The hood is made of copper, which not only has very favorable heat conductivity characteristics, but also provides a nice combination of resilience and physical memory, so that it can be snapped over a component as shown in FIG. 6, coming into pressed, intimate contact with the leads, but does not have so much memory that it is not adequately malleable to permit the skirt portions to be bent inwardly to accommodate undesirable splaying. The hood is preferably shaped and dimensioned such that only the leads of the integrated circuit are contacted, leaving air layers indicated at 30 between the body of the integrated circuit and the hood. This prevents heating the component unnecessarily, which would have no useful purpose, and might damage the component if it is found not to be faulty, and even if it is faulty, there is no point in sapping heat from the hood unnecessarily.

In the first embodiment, the base 12 of the hood is preferably downwardly concave as best illustrated in FIG. 6. In use, the nozzle 32 of a commercially available air gun is directed straight down against the hood as shown in FIGS. 4 and 6. Because of the concavity of the top base portion of the hood, the hot air deflects laterally and slightly upwardly as shown in FIGS. 4 and 6, largely missing the adjacent components 20 on the circuit board, and not disturbing the integrity if their solder connections to the board. Once the gun is applied to the hood, it will take approximately 60 seconds to melt the solder on all four sides and remove the component. This contrasts with about 20 minutes to remove even a 2-sided integrated circuit using a single-point soldering iron, and eliminates virtually all danger to the remaining solder connections on the board, as well as the possibility of inflicting heat damage on other components.

Once the solder has been melted on the four rows of leads of the component, the component may be flipped off any way the operator desires, and then separated from the hood. However, in the preferred embodiment the component is removed by means of a clip 34, which is made of a wire which extends through two opposite gaps between the skirt portions and has a central loop 36 and an extending handle 38. The handle is held between the thumb and forefinger as the hot air gun is operated, and as soon as adequate liquidity of the solder is achieved, the handle is pulled up to remove both the component and the hood from the circuit board.

Immediately after removing the component, it is placed on any convenient adjacent surface, and the handle 38 rotated, while holding the hood and component down to prevent their rotation, causing the loop 36 to flip the hood free of the component. Although the removal of the component from the board, and subsequent removal of the hood from the component, can be accomplished in a less elegant fashion, it is convenient to be able to remove the hood from the component immediately to eliminate any possible complications of the hot solder resolidifying and bonding the copper of the hood to the leads of the integrated circuit.

In the second embodiment of the invention, illustrated in FIGS. 8 through 11, the same basic hood 10, with the base 12 and the skirt portions 14 is used. However, in this embodiment, heat is applied not with a hot air gun but by means of a soldering iron heating element arrangement in which the hood has an integral coupling element such as the block 40 which is engaged between the two tines 42 of the jaw of a soldering iron 44. The block is made of copper or another suitable heat-conductive material, which would ordinarily be brazed or welded to the base 12 of the hood. It has an opening 46 to accommodate the mounting bolt of the soldering iron.

The soldering iron 44 that is illustrated is a standard iron that applicant provides to the circuitboard trade and is characterized by the manner in which it accommodates elongated soldering blades, and mounts the blades at a 45 Degree angle to the axis of the soldering iron handle. The block 40 is configured so that it is removably engagable by this soldering iron, permitting the tip 50, which comprises the hood and the block 40, to be provided as a set of tips of different sizes which are quickly and easily removable from the soldering iron and replaceable with another tip of a different size to accommodate a different integrated circuit or other four-sided component.

The soldering iron 44 is ideally suited as a heat generating and transferring device because it utilizes an elongated heating element 52, held very closely adjacent the upper end of the conducting mass 40. This configuration of the heating element was designed to conduct the maximum amount of heat to an elongated soldering blade, and works very well in this application in which considerable heat must be conducted around to the skirts 14 which contact the component leads.

The second embodiment is illustrated in a very practical implementation in which the tips 50 are rather simple in structure so that they can be inexpensively provided in a set. Alternatively however, the tips could be integrally with a heating element, so that a set of integral heating element/tips would be provided. In this implementation, the handle portion of the soldering iron 44 would be absent, with only the minimum structure provided which would enable the hood to snapped onto an integrated circuit, and lifted off of the circuitboard.

In another modification, the hood 10 could be heated by a pressed-on electrical heating element which was not physically integral with the hood itself. Thus, a separate heating element could be provided to the hood in much the same way that the air gun applies air to the hood. This would enable use of a hood similar or identical to the hood 10, to be provided in an inexpensive set, and a single heating iron provided which could heat any single one of the hoods in the set.

In either of the two embodiments, this tool and this technique are illustrative of the advances in technology in the manufacturing of circuit boards which parallels the increasingly sophisticated technology of the components themselves, resulting in the ever-increasing number of leads necessary in the increasingly complex, very-large-scale integrated circuits that are without a doubt going to become more complex and more highly integrated. The inventor of the instant invention has developed and will continue to develop innovations in the circuit board manufacturing end of the business which are designed to keep up with the advances in technology of the components themselves.

IT IS HEREBY CLAIMED:

1. A desoldering tool for desoldering the peripheral leads of an electronic component having leads on at least two sides, comprising:
   (a) a heat-conductive hood;
   (b) said hood having a substantially planar base portion and depending skirt portions corresponding to said at least two sides of said component; and,
   (c) said tool being shaped and dimensioned such that when said base lies over said component, said skirt portions extend down around said component such that said depending skirt portions contact said leads, such that heating said hood heats said leads and any solder in contact therewith, said base being downwardly concave to deflect a hot air blast away from circuit areas adjacent to said component.

2. A desoldering tool for desoldering the peripheral leads of an electronic component having leads on at least two sides, comprising:
   (a) a heat-conductive hood;
   (b) said hood having a substantially planar base portion and depending skirt portions corresponding to said at least two sides of said component; and,
   (c) said tool being shaped and dimensioned such that when said base lies over said component, said skirt portions extend down around said component such that said depending skirt portions contact said leads, such that heating said hood heats said leads and any solder in contact therewith; and,
   (d) a remover clip having a handle extending outside of said hood and a lever which expands inside said hood to push same away from said component to pop said hood theroff after said component has been removed from the circuit board.

3. Structure according to claim 2 wherein said clip comprises a wire extending between said base and said component and having a bend therein defining said lever.

4. Structure according to claim 3 wherein said wire extends outside said hood and bends to define said handle.

5. Structure according to claim 4 wherein said component is quadralateral in planform and said hood has 4 depending skirt portions with gaps between adjacent ones, and said wire extends outside said hood through one of said gaps.

6. A method of desoldering a quadralateral component from a circuit board, in which said component has a body with a row of leads on each of more than one side thereof, comprising the following steps;
   (a) placing a heat-conductive hood having depending skirt portions over said component such that said skirt portions contact said rows of leads, said hood being spaced from said component except where said skirt portions contact said rows of leads;
   (b) applying heat to said hood with a hot air gun until same is heated sufficiently to conduct adequate heat to said rows of leads to melt solder thereon; and,
   (c) while solder on said leads is melted, removing said component from said circuit board; and,
   (d) said hood having a planar base spanning across said component, and said base being downwardly concave, and step (b) comprising directing air from said air gun substantially vertically centrally downward against said base such that hot air is deflected away from any components on said circuit board adjacent the one being removed.

7. A desoldering tool for desoldering the peripheral leads of an electronic component having leads on at least two sides, comprising:
   (a) a heat-conductive hood;
   (b) said hood having a substantially planar base portion and depending skirt portions corresponding to said at least two sides of said components; and,
   (c) said tool being shaped and dimensioned such that when said base lies over said component, said skirt portions extend down around said component such that said depending skirt portions contact said leads, such that heating said hood heats said leads and any solder in contact therewith;
   (d) a soldering iron with a releasible jaw; and,
   (e) said hood defining a coupling element for releasibly engaging in said jaw, said coupling element comprising a substantially solid block integral with said hood and spanning the greater part of the width thereof to optimize heat transfer from said block, and said jaw comprises a pair of spaced tines compressible together to engage said block.

* * * * *